(12) United States Patent
Parizat et al.

(10) Patent No.: US 10,055,534 B2
(45) Date of Patent: Aug. 21, 2018

(54) SYSTEM AND METHOD FOR DESIGN BASED INSPECTION

(71) Applicant: Applied Materials Israel Ltd., Rehovot (IL)

(72) Inventors: Ziv Parizat, Holon (IL); Moshe Rosenweig, Rehovot (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 134 days.

(21) Appl. No.: 15/073,310

(22) Filed: Mar. 17, 2016

(65) Prior Publication Data

US 2017/0270232 A1    Sep. 21, 2017

(51) Int. Cl.
*G06F 17/50*    (2006.01)

(52) U.S. Cl.
CPC ................ *G06F 17/5081* (2013.01)

(58) Field of Classification Search
USPC ................ 716/50, 51, 52, 53, 54, 55
See application file for complete search history.

(56) References Cited

U.S. PATENT DOCUMENTS

| 2005/0004774 | A1* | 1/2005 | Volk ................ G01N 21/9501 702/108 |
| 2005/0282072 | A1* | 12/2005 | Hector ................ B82Y 10/00 430/5 |
| 2006/0069958 | A1* | 3/2006 | Sawicki ........ G01R 31/318357 714/33 |
| 2006/0095208 | A1* | 5/2006 | Hirscher ............... B82Y 10/00 430/5 |

\* cited by examiner

*Primary Examiner* — Brian Ngo
(74) *Attorney, Agent, or Firm* — Lowenstein Sandler LLP

(57) ABSTRACT

A system for design based inspection of a lithographic mask of a first layer of an article, the system may include a decision module and a memory module; wherein the memory module is configured to store (a) first layer information about an outcome of an illumination of the lithographic mask during a lithographic process, (b) design information related to an irrelevant area to be removed from the first layer of the article after a manufacturing of the first layer of the article; and wherein the decision module is configured to process the first layer information to detect lithographic mask defects and to reduce a significance of a lithographic mask defect that is positioned within the irrelevant area.

9 Claims, 9 Drawing Sheets

US 10,055,534 B2

SYSTEM AND METHOD FOR DESIGN BASED INSPECTION

BACKGROUND OF THE INVENTION

Lithographic masks are exposed during a lithographic process to radiation thereby forming patterns on a wafer.

A lithographic mask error may result in a large number of defective wafers. Different mask errors may be associated with different costs.

On one hand there is a need to rigorously inspect lithographic masks as the cost associated with some lithographic masks error is high.

On the other hand the inspection of the lithographic process should be relatively fast.

There is a growing need to provide accurate and fast methods for inspecting a lithographic mask while taking into account the cost associated with mask errors.

SUMMARY

According to an embodiment of the invention there may be provided a system for design based inspection of a lithographic mask of a first layer of an article, the system may include a decision module and a memory module; wherein the memory module may be configured to store (a) first layer information about an outcome of an illumination of the lithographic mask during a lithographic process, (b) design information related to an irrelevant area to be removed from the first layer of the article after a manufacturing of the first layer of the article; and wherein the decision module may be configured to process the first layer information to detect lithographic mask defects and to reduce a significance of a lithographic mask defect that is positioned within the irrelevant area.

According to an embodiment of the invention there may be provided a method for design based inspection of a lithographic mask of a first layer of an article, the method may include receiving or generating first layer information about an outcome of an illumination of the lithographic mask during a lithographic process; receiving or generating design information related to an irrelevant area to be removed from the first layer of the article after a manufacturing of the first layer of the article; and processing, by a decision module, the first layer information to detect lithographic mask defects while reducing a significance of a lithographic mask defect that is positioned within the irrelevant area.

The design information related to the irrelevant area may not be included in the first layer information.

The irrelevant area may belong to a second layer of the article that is manufactured by illumination of a second lithographic mask during the lithographic process.

The design information may be related to multiple irrelevant areas to be removed from the first layer of the article after the manufacturing of the first layer of the article; and the decision module may be configured to process the first layer information to detect lithographic mask defects and to ignore lithographic masks defect that are positioned within the multiple irrelevant areas.

The design information related to the multiple irrelevant areas may belong to design information related to a plurality of layers of the article.

The reducing of the significance of a lithographic mask defect that is positioned within the irrelevant area may include ignoring the lithographic mask defect that is positioned within the irrelevant area.

The reducing of the significance of the lithographic mask defect that is positioned within the irrelevant area may include increasing a sensitivity threshold related to the lithographic mask defect that is positioned within the irrelevant area.

According to an embodiment of the invention there may be provided a non-transitory computer readable medium that may store instructions that once executed by a computer cause the computer to execute the steps of: receiving or generating first layer information about an outcome of an illumination of a lithographic mask during a lithographic process; receiving or generating design information related to an irrelevant area to be removed from the first layer of an article after a manufacturing of the first layer of the article; and processing, by a decision module, the first layer information to detect lithographic mask defects while reducing a significance of a lithographic mask defect that is positioned within the irrelevant area.

According to an embodiment of the invention there may be provided a method for design based inspection of a lithographic mask, the method may include receiving or generating design information related to an irrelevant area of a first layer of an article; wherein the first layer is manufactured by illuminating the lithographic mask during a lithographic process; receiving or generating first layer information about an actual outcome or an expected outcome of the illuminating of the lithographic mask during the lithographic process; searching in the first layer information for information about a layout of the irrelevant area; searching for a differentiating attribute that differentiates the layout of the irrelevant area from a layout of a relevant area of the first layer; and searching, using the differentiating attribute, for one or more other irrelevant areas of the first layer.

The first layer information may be an aerial image of the lithographic mask.

The first layer information may be an image of the lithographic mask that differs from an aerial image of the lithographic mask.

According to an embodiment of the invention there may be provided a non-transitory computer readable medium that may store instructions that once executed by a computer cause the computer to execute the steps of: receiving or generating design information related to an irrelevant area of a first layer of an article; wherein the first layer is manufactured by illuminating a lithographic mask during a lithographic process; receiving or generating first layer information about an actual outcome or an expected outcome of the illuminating of a lithographic mask during the lithographic process; searching in the first layer information for information about a layout of the irrelevant area; searching for a differentiating attribute that differentiates the layout of the irrelevant area from a layout of a relevant area of the first layer; and searching, using the differentiating attribute, for one or more other irrelevant areas of the first layer.

According to an embodiment of the invention there may be provided a system for design based inspection of a lithographic mask, the system may include a search module, a decision module and a memory module; wherein the memory module may be configured to store (a) design information related to an irrelevant area of a first layer of an article; wherein the first layer is manufactured by illuminating the lithographic mask during a lithographic process, and (b) first layer information about an actual outcome or an expected outcome of the illuminating of the lithographic mask during the lithographic process; wherein the decision module may be configured to: (i) search in the first layer information for information about a layout of the irrelevant area; (ii) search for a differentiating attribute that differentiates the layout of the irrelevant area from a layout of a relevant area of the first layer; and (iii) search, using the differentiating attribute, for one or more other irrelevant areas of the first layer.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
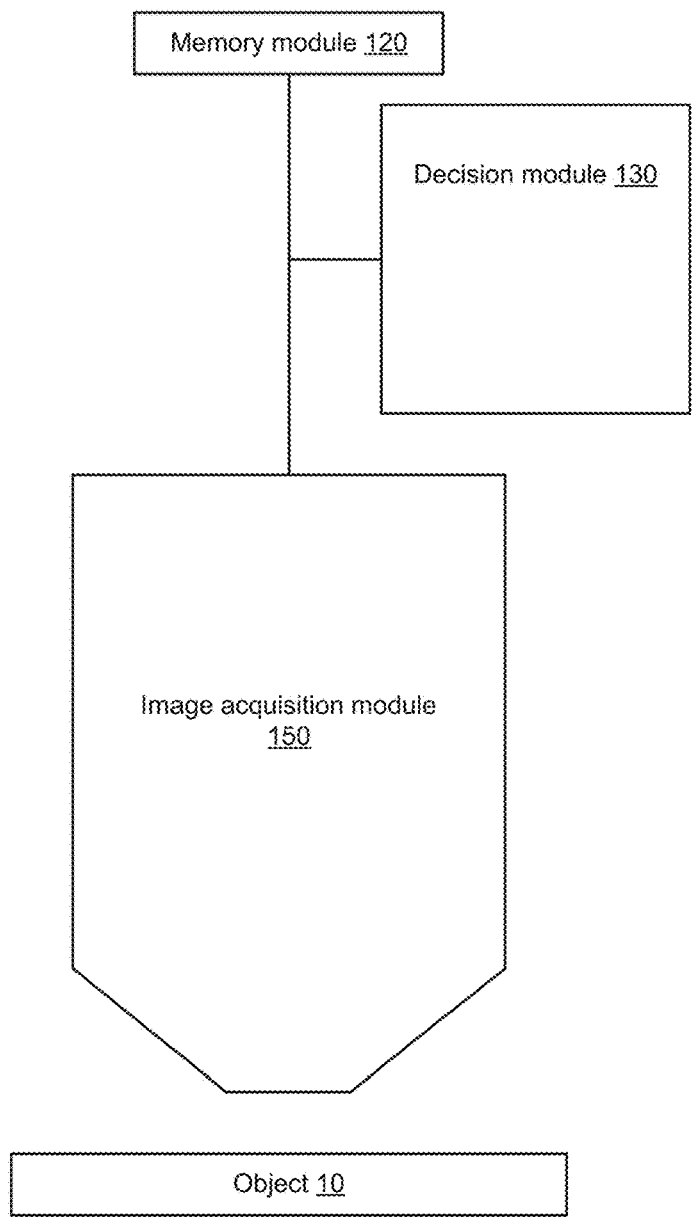
FIG. 1 illustrates a system according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The term "first layer" may refer to any layer of an article. Any reference to the first layer should be interpreted as a reference of any layer of an article.

According to an embodiment of the invention the significance of a lithographic mask defect that is positioned within an irrelevant area can be reduced. The reduction in the significance can involve ignoring the lithographic mask defect that is positioned within the irrelevant area. In the following text the ignoring of the lithographic mask defect that is positioned within the irrelevant area is provided as a non-limiting example of a reduction in the significance of the lithographic mask defect that is positioned within the irrelevant area.

FIG. 1 illustrates system 101 according to an embodiment of the invention.

System 101 may be a desktop computer, a server, a laptop computer, a mobile computerized system, a combination of computers, and the like.

System 101 includes a decision module 130, memory module 120. System 101 may include inspection module 150. Alternatively, system 101 may receive first, second, third and fourth layer information from an inspection module 150 that is not a part of the system.

Figure 2:
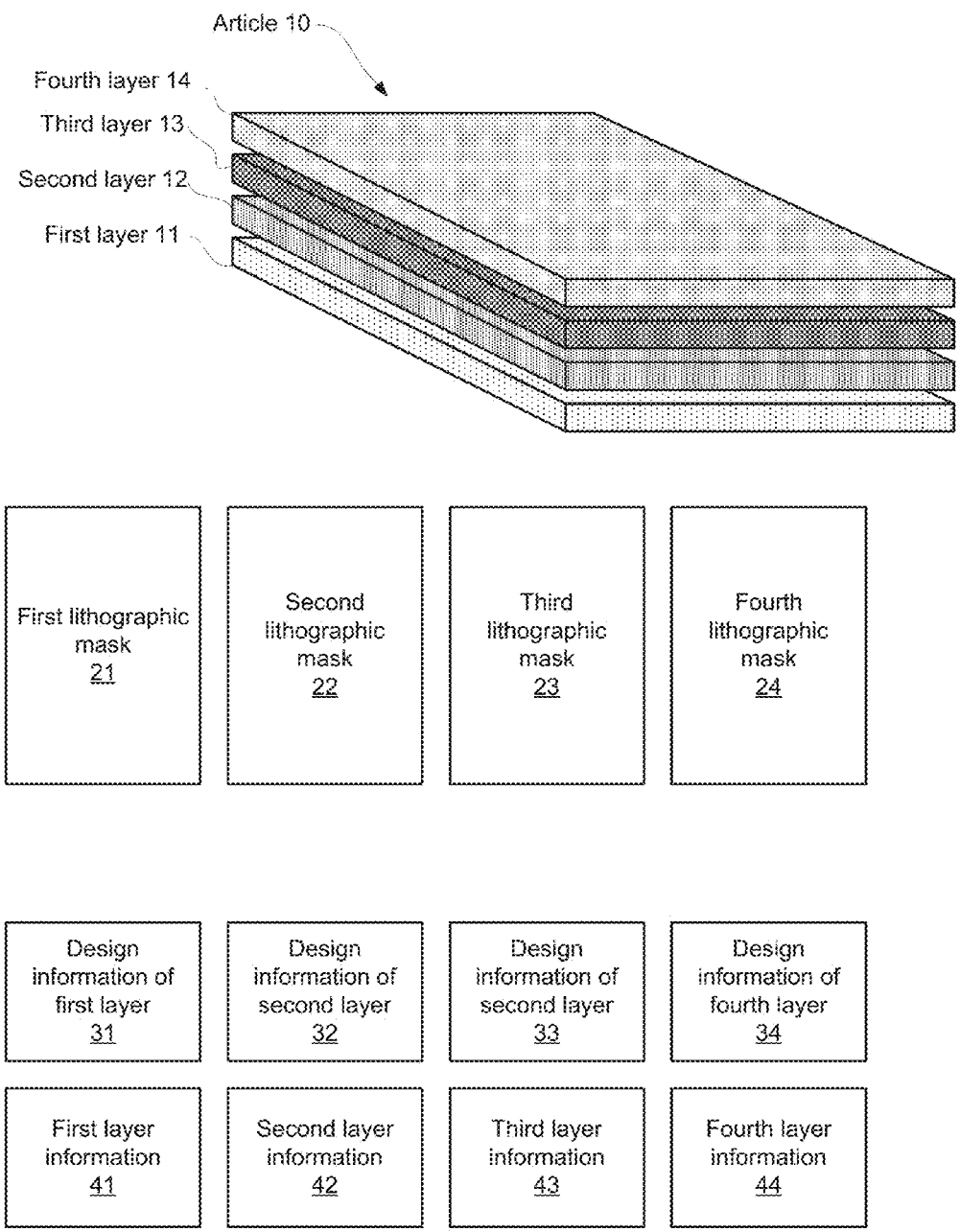
FIG. 2 illustrates an article that includes four layers various information entities according to an embodiment of the invention.

The first, second, third and fourth layer information are shown in greater details in FIG. 2 and represent an article 10 that has four layers.

The article 10 may be a semiconductor die, a micro electro machined (MEMS) device, a nano electro machined (NEMS) device, a solar panel or any article that has microscopic features.

The article may include more than four layers.

First layer 11 is manufacturing by a lithographic process that includes exposing first lithographic mask 21 to electromagnetic radiation in order to form patterns on the first layer. The desired patterns of the first layer may be defined by design information of the first layer 31.

The design information may be computer aided design (CAD) information and may include GDSII files or any other format of CAD information.

Second layer 12 is manufacturing by a lithographic process that includes exposing second lithographic mask 22 to electromagnetic radiation in order to form patterns on the second layer. The desired patterns of the second layer may be defined by design information of the second layer 32.

Third layer 13 is manufacturing by a lithographic process that includes exposing third lithographic mask 23 to electromagnetic radiation in order to form patterns on the third layer. The desired patterns of the third layer may be defined by design information of the third layer 33.

Fourth layer 14 is manufacturing by a lithographic process that includes exposing fourth lithographic mask 24 to electromagnetic radiation in order to form patterns on the fourth layer. The desired patterns of the fourth layer may be defined by design information of the fourth layer 34.

Each one of first layer 11, second layer 12, third layer 13 and the fourth layer 14 may be also represented by information that is not design information but rather represents the actual or expected layer that is generated during the lithographic process.

First layer 11 may be represented by first layer information 41. The first layer information 41 may be an aerial image of first lithographic mask or a non-aerial image of first lithographic mask.

Second layer 12 may be represented by second layer information 42. The second layer information 42 may be an aerial image of second lithographic mask or a non-aerial image of second lithographic mask.

Third layer 13 may be represented by third layer information 43. The third layer information 43 may be an aerial image of third lithographic mask or a non-aerial image of third lithographic mask.

Fourth layer 14 may be represented by fourth layer information 44. The fourth layer information 44 may be an aerial image of fourth lithographic mask or a non-aerial image of fourth lithographic mask.

Any one of the first, second, third and fourth layer information may be an expected image that is expected to be formed on a photoresist during the lithographic process that involves illuminating the lithographic mask. The expected image may be an Aerial image of the first, second, third and fourth layer lithographic mask, respectively.

Referring back to FIG. 1—inspection module 150 may be configured to inspect each one of first lithographic mask 21, second lithographic mask 22, third lithographic mask 23 and fourth lithographic mask 24 and to generate first layer information 41, second layer information 42, third layer information 43 and fourth layer information 44.

The inspection module 150 may inspect any lithographic mask by using one or more beams of electromagnetic radiation. The electromagnetic radiation may be, for example, visible light radiation, ultra violet radiation, deep ultraviolet radiation, extreme ultraviolet radiation, electron beam radiation, infrared radiation, and the like. Decision module 130 may be one or more hardware processors or may be hosted by one or more hardware processors that are configured to execute instructions that facilitate searching for printable features and for assigning different lithographic mask inspection process parameter to different areas of the lithographic mask. A hardware processor can represent one or more general-purpose processing devices such as a microprocessor, central processing unit, or the like. More particularly, the hardware processor may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The hardware processor may also be one or more special-purpose processing devices such as an application specific integrated circuit (ASIC), a field programmable gate array (FPGA), a digital signal processor (DSP), network processor, or the like.

Memory module 120 is configured to store various information entities listed in FIG. 2. Memory module 120 may include one or more of a main memory (e.g., read-only memory (ROM), flash memory, dynamic random access memory (DRAM) such as synchronous DRAM (SDRAM)), a static memory (e.g., flash memory, static random access memory (SRAM)), and a data storage device, which can communicate with each other and/or the processor via a bus. A computer-readable medium on which is stored one or more sets of instructions which may embody any one or more of the methodologies or functions described herein can reside on the storage device, and/or completely or at least partially within the main memory and/or within the processor during execution thereof by the computer system 101.

According to an embodiment of the invention, decision module 130 is configured to perform at least one of the following:

a. Process the first layer information to detect lithographic mask defects and to reduce a significance of a lithographic mask defect that is positioned within the irrelevant area. The reduction of significance can include ignoring the lithographic mask defect that is positioned within the irrelevant area. Alternatively, the reduction of significance can include increasing a sensitivity threshold related to the lithographic mask defect that is positioned within the irrelevant area therefore processing only significant defects.

b. Search in layer information (that differs from design information of the layer) for information about a layout of the irrelevant area. Search for a differentiating attribute that differentiates the layout of the irrelevant area from a layout of a relevant area of the first layer. Search, using the differentiating attribute, for one or more other irrelevant areas of the first layer.

A significant lithographic mask defect causes a significant wafer defect. The significance of the defect may be determined in various manners. For example, the significance of the wafer defect may be determined by the wafer manufacturer, by a customer of the wafer manufacturer or by any other party. The significance of the wafer defect may be responsive to a location of the wafer defect, to the size of the wafer defect, to an actual or expected deterioration in the performance of the device that includes a die of the wafer. For example, the device may include a critical path or a critical area and wafer defects located at the critical path (or critical area) may deem the device nonfunctional.

The significance of a lithographic defect may, for example, reflect an expected (even not current) impact of the defect. The significance of a lithographic mask defect can change over time. For example, a lithographic mask defect can expand over time due to a chemical reaction or even change position. Yet for example, some lithographic mask defects (such as foreign particles) can move form location over time—for example from a non-critical area to a critical area.

A sensitivity threshold is placed on mask defect attributes that predict the connection between the mask defect significance to the wafer defect significance for example: defect signal, defect size, defect CD variation measurement in Aerial image (or Aerial simulation that simulates how the defect will appear on the wafer). On significant areas the sensitivity threshold will be tighter then on non-significant areas.

Figure 3:
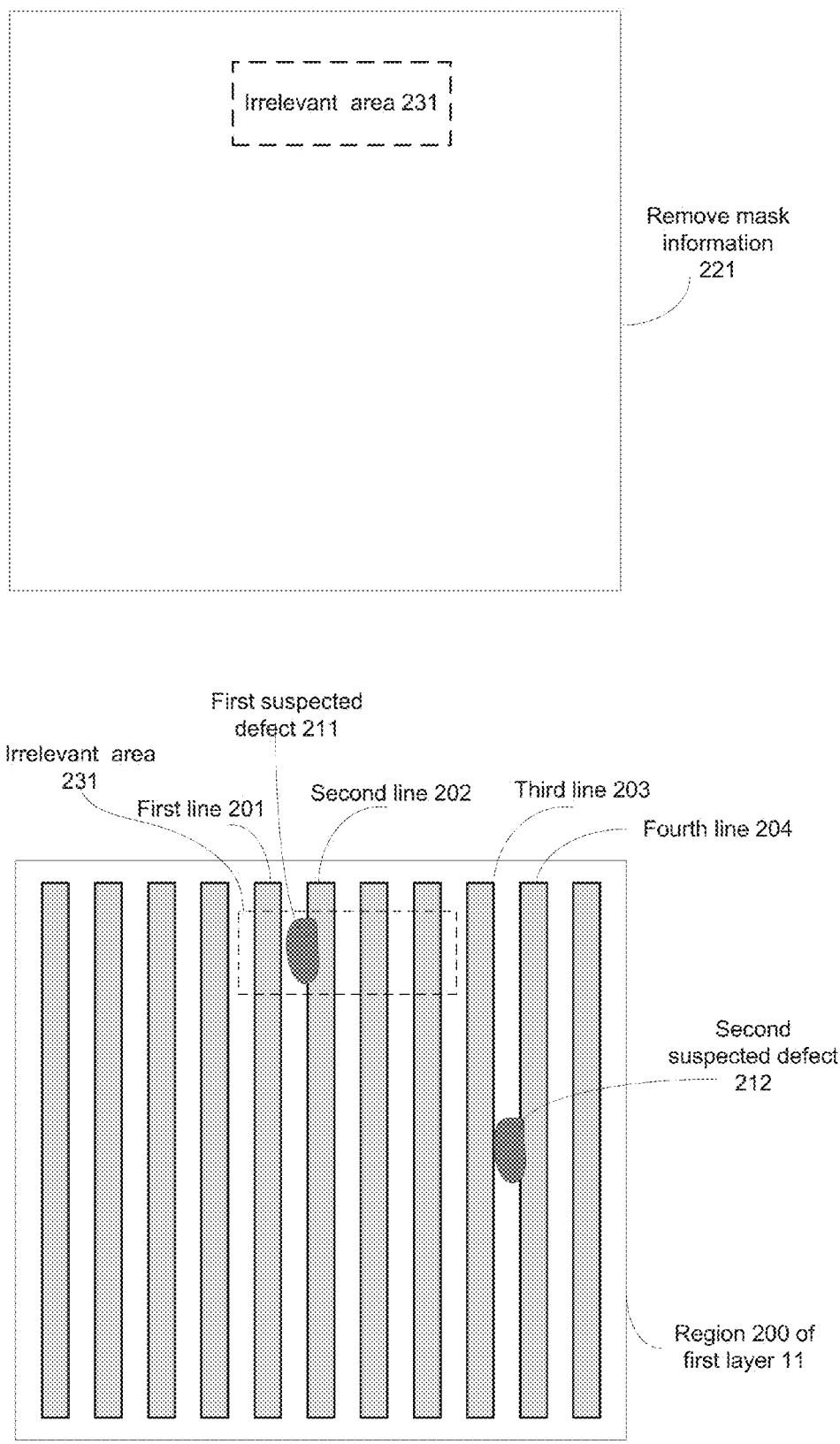
FIG. 3 illustrates remove mask information that defines an irrelevant area to be removed from first layer after the first layer is manufactured.

FIG. 3 illustrates first remove mask information 221 that defines a first irrelevant area 231 to be removed from first layer 11 after the first layer is manufactured.

Accordingly—the removal of first irrelevant area 231 may occur after the completion of the illuminating of the first lithographic mask 21 to electromagnetic radiation, during the lithographic process.

First remove mask information 221 may be included in at least one out of (i) the design information of second layer 32, (ii) design information of the third layer 33 or (iii) design information of fourth layer 34 or may be included elsewhere.

The first remove mask information 221 may define a remove mask may define an etch stop mask or another mask that defines which area of the first layer 11 should be removed. A non-limiting example of an irrelevant area may include a sacrificial layer.

FIG. 3 also illustrates a region 200 of first layer 11. Region 200 is described in first layer information 41.

Region 200 includes multiple line shaped conductors such as first line 201, second line 202, third line 203 and fourth line 204.

Region 200 includes a first suspected defect 211 and a second suspected defect 212. The first suspected defect 211 is illustrated as being excess material that may electrically couple the first line 201 to the second line 202. The second suspected defect 212 is illustrated as being excess material that may electrically couple the third line 203 to the fourth line 204.

The first suspected defect 211 is located within first irrelevant area 231 and can be ignored of.

The second suspected defect 212 is located outside first irrelevant area 231 and cannot be ignored of.

Figure 4:
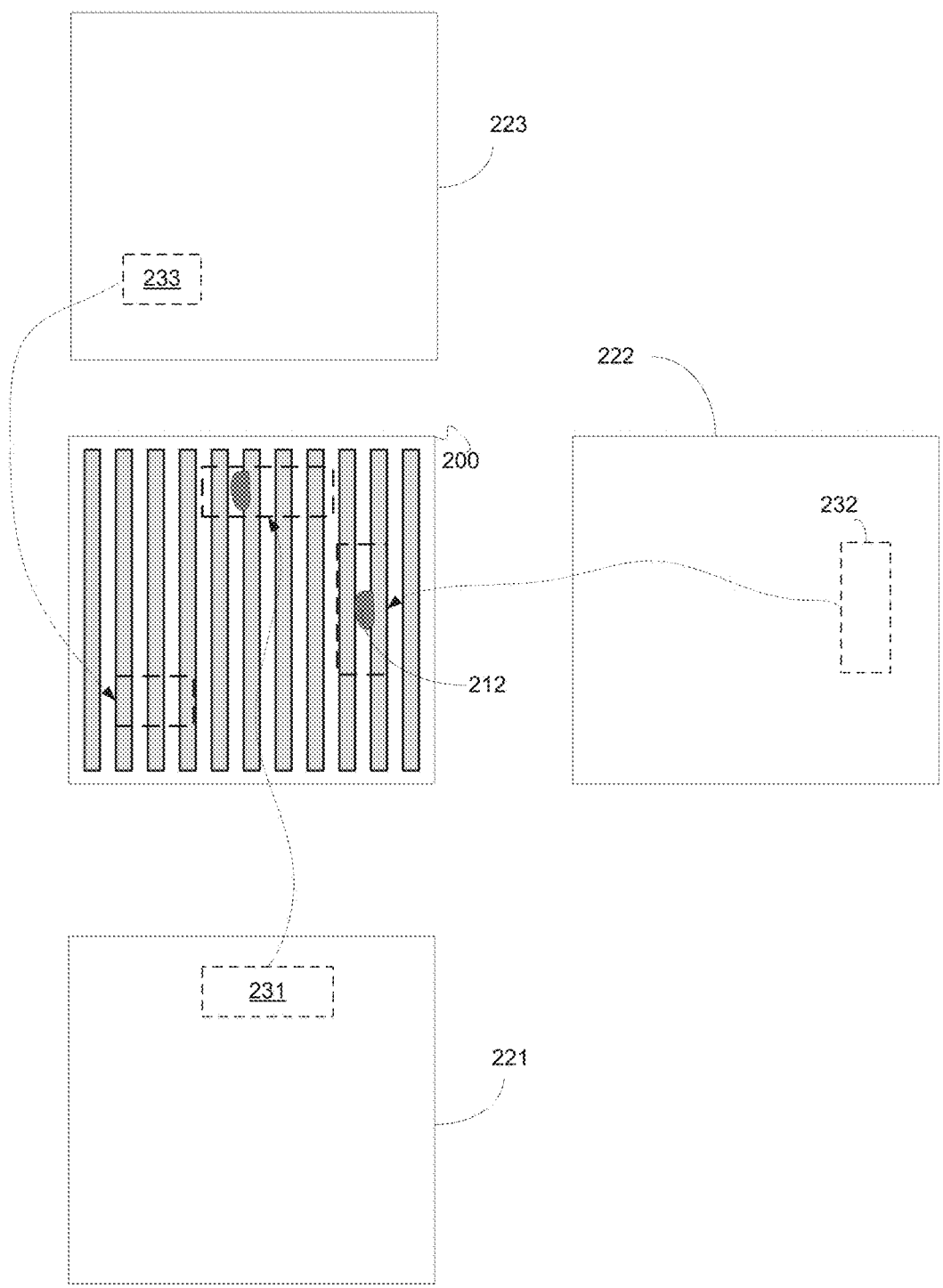
FIG. 4 illustrates remove mask information that defines irrelevant areas to be removed from a first layer after the first layer is manufactured.

FIG. 4 illustrates first remove mask information 221, second remove mask information 222 and third remove mask information 223 that define first irrelevant area 231, second irrelevant area 232 and third irrelevant area 233.

The first irrelevant area 231, second irrelevant area 232 and third irrelevant area 233 are areas that are removed from first layer 11 after the first layer is manufactured by illuminating the first lithographic mask during a lithographic process.

The first suspected defect 211 is located within first irrelevant area 231 and can be ignored of.

The second suspected defect 212 is located within second irrelevant area 232 and can be ignored of.

Each one of first, second and third remove mask information 221, 222 and 223 may be included in at least one out of the design information of second layer 32, design information of the third layer 33 or design information of fourth layer 34 or may be included elsewhere.

First remove mask information 221 may be included in design information of second layer 32 while second remove mask information 222 may be included in design information of third layer 33 and third remove mask information 223 may be included in design information of fourth layer 34.

Alternatively, at least two out of first, second and third remove mask information 221, 222 and 223 may be included in the design information of the same layer.

Figure 5:
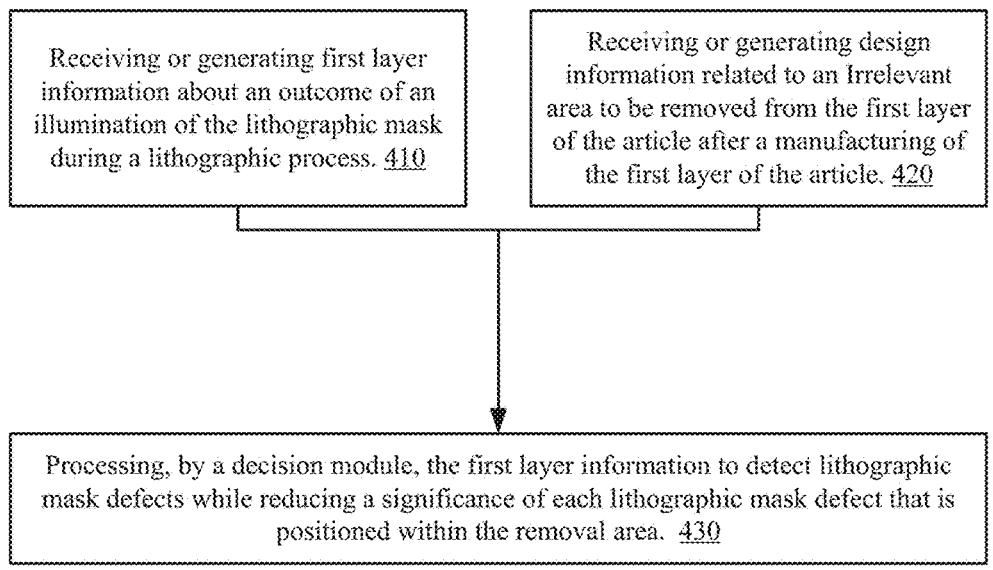
FIG. 5 illustrates a method according to an embodiment of the invention.

FIG. 5 illustrates method 500 according to an embodiment of the invention.

Method 400 may start by steps 410 and 420.

Step 410 may include receiving or generating first layer information about an expected outcome or an actual outcome of an illumination of the lithographic mask during a lithographic process. The first layer information may be received and stored in memory module 120 of FIG. 2. The first layer information may be generated by decision module 130 of FIG. 2, may be generated by a processor (not shown) of system 101 of FIG. 2 or may be generated by a system that differs from system 101 of FIG. 2.

A non-limiting example of expected outcome of the illumination of the lithographic mask during a lithographic process may include an image of the lithographic mask.

A non-limiting example of an actual outcome of the illumination of the lithographic mask during a lithographic process may include an image of the layer that was generated during the lithographic process.

Step 420 may include receiving or generating design information related to an irrelevant area to be removed from the first layer of the article after a manufacturing of the first layer of the article. The design information related to the irrelevant area may be received and stored in memory module 120 of FIG. 2. The design information related to the irrelevant area may be generated by decision module 130 of FIG. 2, may be generated by a processor (not shown) of system 101 of FIG. 2 or may be generated by a system that differs from system 101 of FIG. 2.

Steps 410 and 420 may be followed by step 430 of processing, by the decision module, the first layer information to detect lithographic mask defects while reducing a significance of a lithographic mask defect that is positioned within the irrelevant area.

The design information related to the irrelevant area may or may not be included in the first layer information.

The design information related to the irrelevant area may or may not be included in information of a layer that is not the first layer.

The design information may be related to multiple irrelevant areas to be removed from the first layer of the article after the manufacturing of the first layer of the article.

Step 430 may include processing the first layer information to detect lithographic mask defects while reducing a significance of each lithographic masks defect that are positioned within the multiple irrelevant areas.

Figure 6:
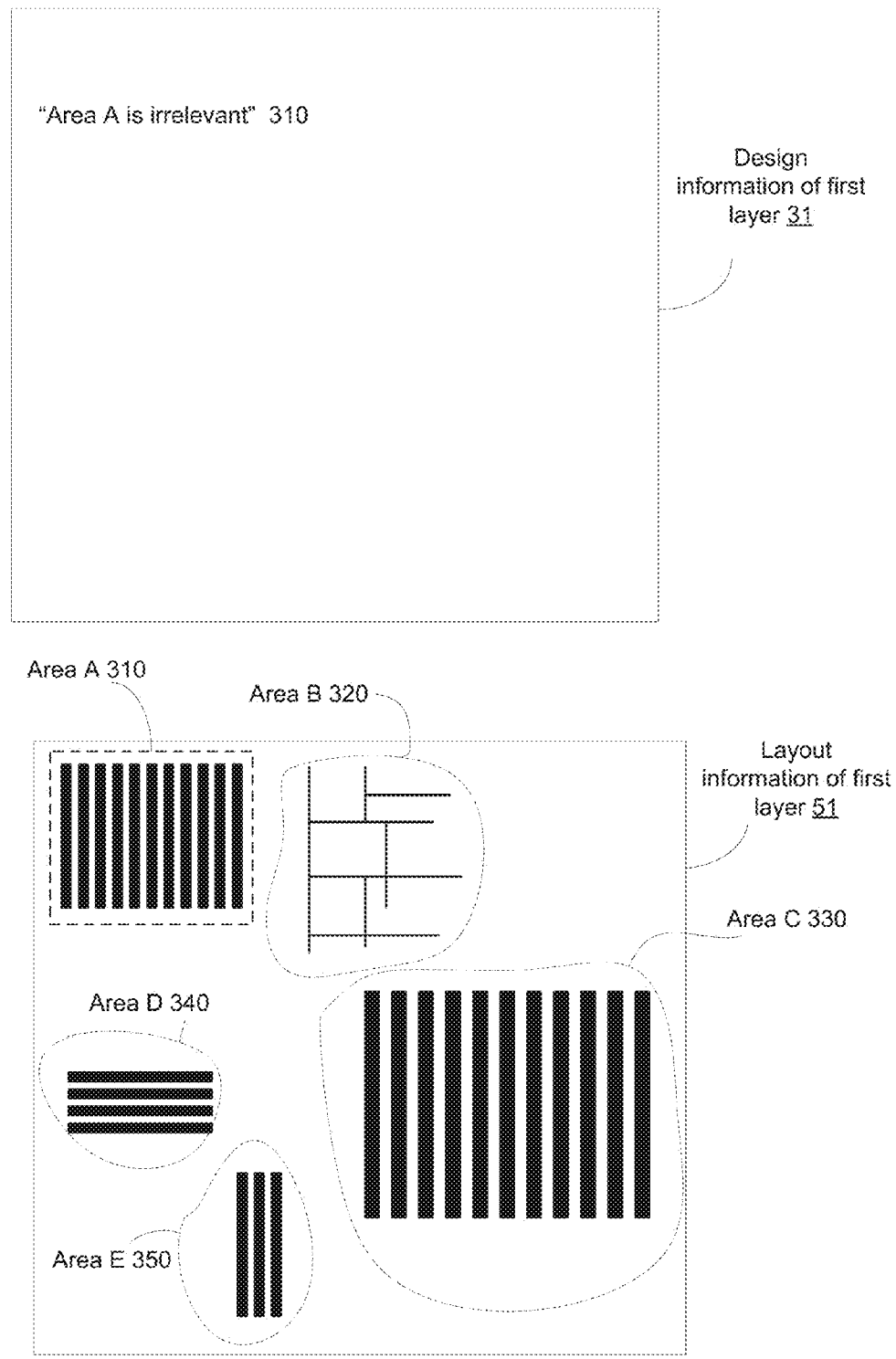
FIG. 6 illustrates design information of a first layer and first layer information according to an embodiment of the invention.

FIG. 6 illustrates design information of first layer 31 and first layer information 41.

The layout information of first layer 51 may be an aerial image or a non-aerial image of first lithographic mask.

The design information of the first layer 31 may include a tag, a remark or any other metadata (denoted "Area A is irrelevant" 310) that indicates that a certain area (such as area A) is irrelevant. The irrelevancy is determined in advance—for example by the chip designer and may include dummy patterns, regions of a dies that are not used in a certain batch of dies, and the like. Area A is defined in the metadata of in another location within the design information of the first layer. The definition may include, for example, the shape and size of Area A.

The metadata may be fed by a user, administrator or any other entity using a graphic user interface or using any known technology.

The layout information of first layer 51 illustrates the first layer 11 as including various areas such as area A 310, area B 320, area C 330, area D 340 and area E 350.

Area A 310 include a dense arrangement of parallel conductors, area B 320 is a logic area that includes a maze of conductors, area C 330 includes a sparse arrangement of parallel conductors, area D 340 includes an arrangement of parallel conductors that is smaller and less dense that the conductors of area A 310 and is oriented to the conductors of area A 310. Area E 350, area D 340 includes an arrangement of parallel conductors that is smaller than the arrangement of conductors of area A but is of a same density as the conductors of area A.

Figure 7:
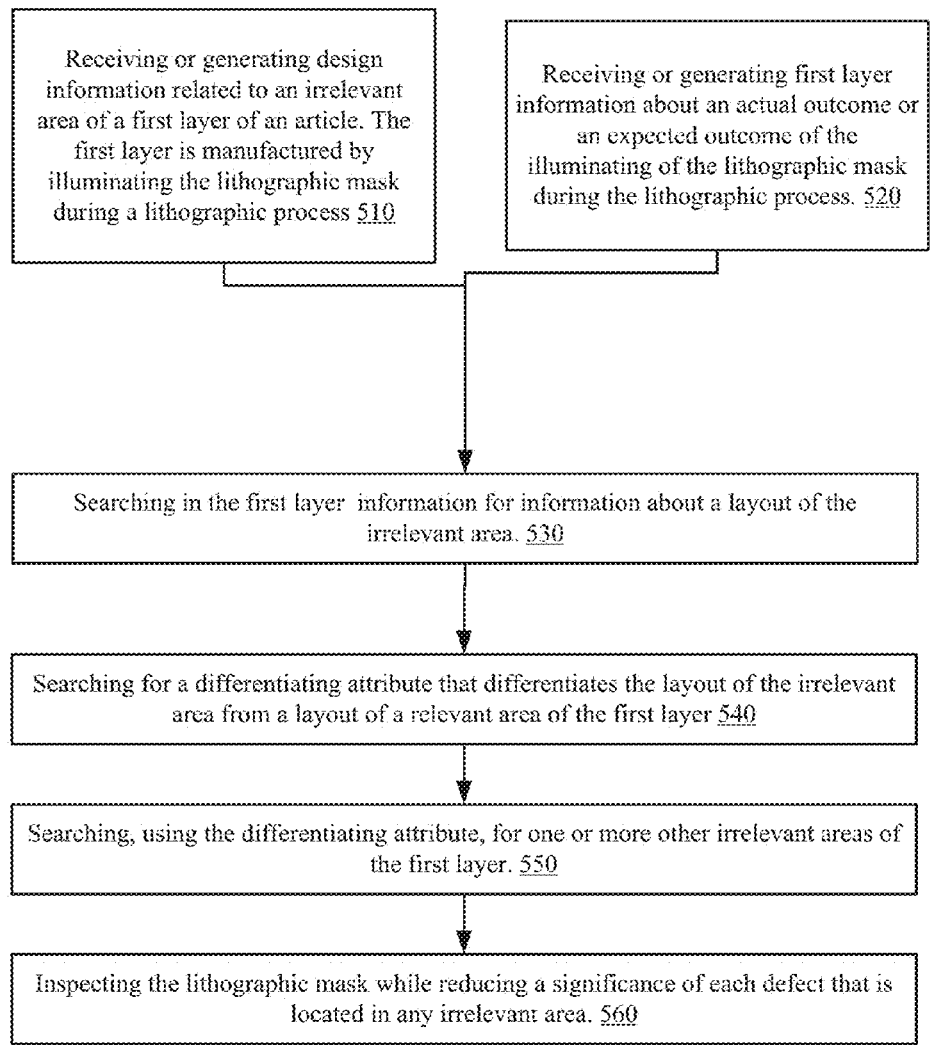
FIG. 7 illustrates a method according to an embodiment of the invention.

FIG. 7 illustrates method 500 according to an embodiment of the invention.

Method 500 may start by steps 510 and 520.

Step 510 may include receiving or generating design information related to an irrelevant area of a first layer of an article. The first layer is manufactured by illuminating the lithographic mask during a lithographic process.

Step 520 may include receiving or generating first layer information about an actual outcome or an expected outcome of the illuminating of the lithographic mask during the lithographic process.

The first layer information may be an aerial image of the lithographic mask.

The first layer information may be an image of the lithographic mask that differs from an aerial image of the lithographic mask.

Steps 510 and 520 may be followed by step 530 of searching in the first layer information for information about a layout of the irrelevant area.

Step 530 may be followed by step 540 of searching for a differentiating attribute that differentiates the layout of the irrelevant area from a layout of a relevant area of the first layer.

For example, referring to FIG. 5, the density of the conductors of area A 310 may be regarded as a differentiating attribute. In this case, step 540 may include searching for an arrangement of conductors that are dense as those of Area A 310.

Step 540 may be followed by step 550 of searching, using the differentiating attribute, for one or more other irrelevant areas of the first layer. For example—area E 350 can be regarded as an irrelevant area as area E 350 and area A 310 share the same density.

Step 550 may be followed by step 560 of inspecting the lithographic mask while reducing a significance of each defect that is located in any irrelevant area.

Figure 8:
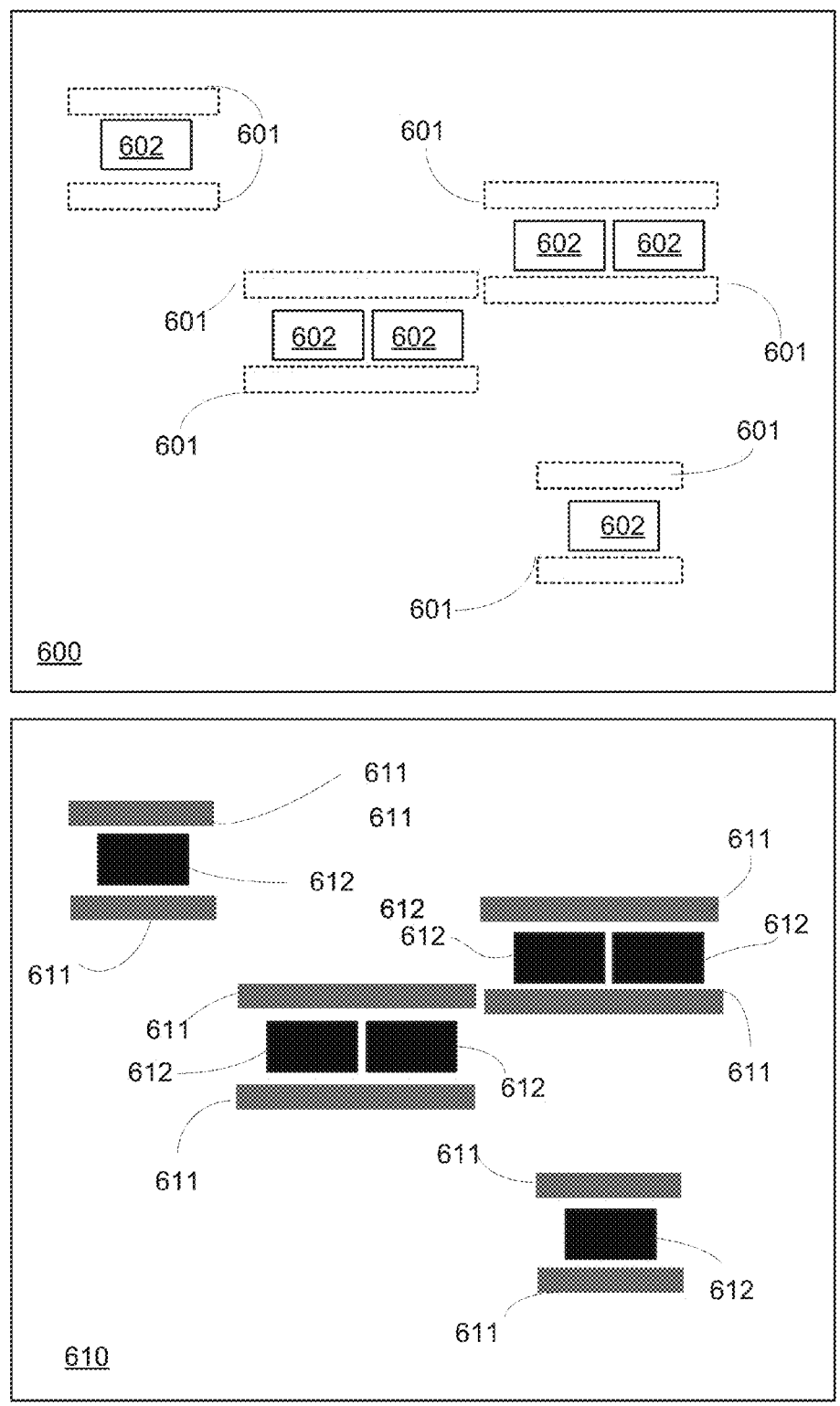
FIG. 8 illustrates design information of an article manufactured by a lithographic mask and layout information of the article according to an embodiment of the invention.

FIG. 8 illustrates design information 600 of an article manufactured by a lithographic mask and layout information 610 of the article according to an embodiment of the invention.

The design information 600 indicates that the article includes relevant features 602 and irrelevant features 601. The layout information 610 includes relevant features 612 and irrelevant features 611. Relevant features 612 differ from irrelevant features 611 by width and by gray level. Accordingly—the differentiating attributes may be the gray level value and/or the width of the irrelevant features.

Figure 9:
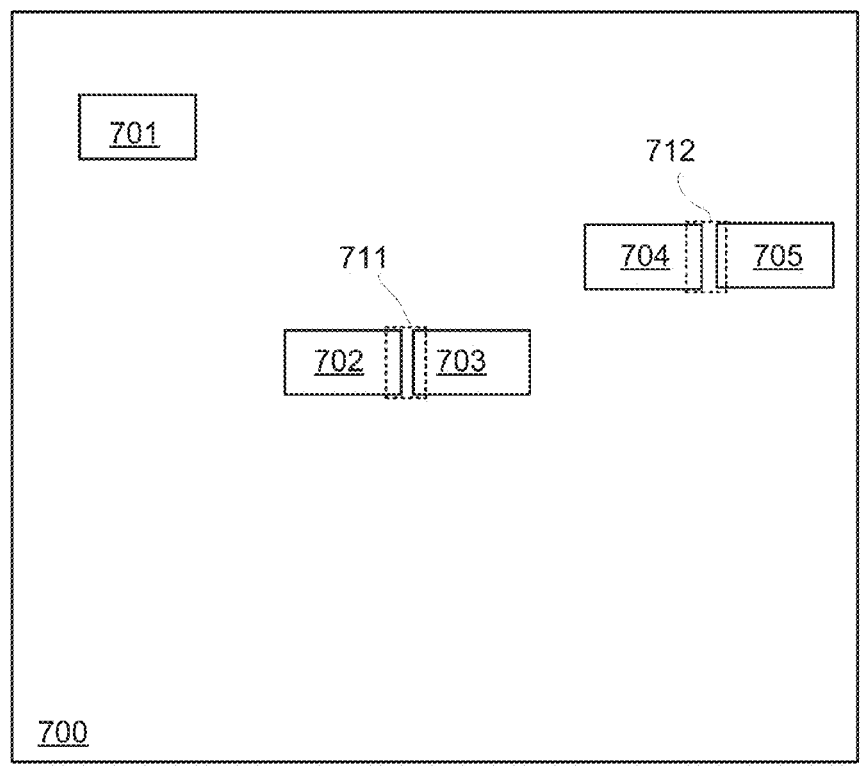
FIG. 9 illustrates design information of an article according to an embodiment of the invention.

FIG. 9 illustrates design information 700 of an article according to an embodiment of the invention.

It is assumed that when two elements of the article are proximate to each other (distance between the two elements is below a predefined threshold)—the area between the two elements is irrelevant.

Design information 700 illustrates elements 701, 702, 703, 704 and 705. The distance between elements 702 and 703 is below a predefined threshold and the area between elements 702 and 703 is deemed to be irrelevant—as indicated by irrelevancy region 711.

The distance between elements 704 and 705 is below a predefined threshold and the area between elements 704 and 705 is deemed to be irrelevant—as indicated by irrelevancy region 712.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A system for design based inspection of a lithographic mask of a first layer of a semiconductor article, the system comprising:
    a memory; and
    a processor, operatively coupled with the memory, to:
        receive first layer information about an outcome of an illumination of the lithographic mask during a lithographic process;
        receive design information related to an irrelevant area to be removed from the first layer of the semiconductor article after a manufacturing of the first layer of the semiconductor article; and
        detect lithographic mask defects based on the first layer information and the design information, wherein the detection reduces a significance of a lithographic mask defect that is positioned within the irrelevant area.

2. A method for design based inspection of a lithographic mask of a first layer of a semiconductor article, the method comprising:
    receiving first layer information about an outcome of an illumination of the lithographic mask during a lithographic process;
    receiving design information related to an irrelevant area to be removed from the first layer of the semiconductor article after a manufacturing of the first layer of the semiconductor article; and
    detecting, by a processor, lithographic mask defects based on the first layer information and the design information, wherein the detection reduces a significance of a lithographic mask defect that is positioned within the irrelevant area.

3. The method according to claim 2 wherein the design information related to the irrelevant area is not included in the first layer information.

4. The method according to claim 2 wherein the irrelevant area belongs to a second layer of the semiconductor article that is manufactured by illumination of a second lithographic mask during the lithographic process.

5. The method according to claim 2 wherein the design information is related to multiple irrelevant areas to be removed from the first layer of the semiconductor article after the manufacturing of the first layer of the semiconductor article, and wherein the detecting of the lithographic mask defects comprises ignoring lithographic mask defects that are positioned within the multiple irrelevant areas.

6. The method according to claim 5 wherein the design information related to the multiple irrelevant areas belongs to design information related to a plurality of layers of the semiconductor article.

7. The method according to claim 2 wherein the reducing the significance of the lithographic mask defect that is positioned within the irrelevant area comprises ignoring the lithographic mask defect that is positioned within the irrelevant area.

8. The method according to claim 2 wherein the reducing the significance of the lithographic mask defect that is positioned within the irrelevant area comprises increasing a sensitivity threshold related to the lithographic mask defect that is positioned within the irrelevant area.

9. A non-transitory computer readable medium that stores instructions, which when executed by a processor, cause the processor to perform operations comprising:
    receiving first layer information about an outcome of an illumination of a lithographic mask during a lithographic process;
    receiving design information related to an irrelevant area to be removed from the first layer of a semiconductor article after a manufacturing of the first layer of the semiconductor article; and
    detecting lithographic mask defects based on the first layer information and the design information, wherein the detection reduces a significance of a lithographic mask defect that is positioned within the irrelevant area.

* * * * *